United States Patent
Liu et al.

(10) Patent No.: US 10,018,515 B2
(45) Date of Patent: Jul. 10, 2018

(54) TRANSISTOR TEMPERATURE SENSING

(71) Applicant: QUALCOMM Incorporated, San Diego, CA (US)

(72) Inventors: Yanxiang Liu, Glenville, NY (US); Haining Yang, San Diego, CA (US); Kern Rim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 337 days.

(21) Appl. No.: 14/856,004

(22) Filed: Sep. 16, 2015

(65) Prior Publication Data

US 2017/0074728 A1    Mar. 16, 2017

(51) Int. Cl.
   *G01K 7/01*      (2006.01)
   *H01L 27/092*    (2006.01)
   *H01L 29/786*    (2006.01)

(52) U.S. Cl.
   CPC .......... *G01K 7/015* (2013.01); *H01L 27/0924* (2013.01); *H01L 29/78606* (2013.01)

(58) Field of Classification Search
   CPC ...................................................... G01K 7/015
   See application file for complete search history.

(56) References Cited

U.S. PATENT DOCUMENTS

| | | | |
|---|---|---|---|
| 6,316,971 B1 | 11/2001 | Ohashi | |
| 6,489,831 B1 | 12/2002 | Matranga et al. | |
| 7,255,476 B2 * | 8/2007 | Franch | G01K 7/01 327/513 |
| 7,348,642 B2 * | 3/2008 | Nowak | H01L 29/66818 257/401 |
| 7,550,773 B2 * | 6/2009 | Booth, Jr. | H01L 29/66795 257/347 |
| 2004/0140826 A1 | 7/2004 | Asam et al. | |
| 2011/0013668 A1 | 1/2011 | Pacha et al. | |
| 2013/0120930 A1 * | 5/2013 | Temkine | G06F 1/206 361/679.47 |
| 2014/0369381 A1 * | 12/2014 | Horng | G01K 7/01 374/102 |
| 2015/0035568 A1 | 2/2015 | Peng et al. | |
| 2015/0098489 A1 | 4/2015 | Lee et al. | |

FOREIGN PATENT DOCUMENTS

WO    2015012798 A1    1/2015

OTHER PUBLICATIONS

Remarsu, S., "On Process Variation Tolerant Low Cost Thermal Sensor Design," Masters Theses 1896—Feb. 2014, Dissertations and Theses, Feb. 2011, University of Massachusetts, Amherst, 72 pages.

(Continued)

*Primary Examiner* — Clayton E Laballe
*Assistant Examiner* — Leon W Rhodes, Jr.
(74) *Attorney, Agent, or Firm* — Qualcomm Incorporated-Toler (57) ABSTRACT

A device includes a source contact, a drain contact, a gate contact, and a body contact. The body contact is electrically coupled to a temperature sensing circuit. The source contact, the drain contact, the gate contact, and the body contact are included in a fin field-effect transistor (finFET).

30 Claims, 7 Drawing Sheets

(56) References Cited

OTHER PUBLICATIONS

Shrivastava, M., et al., "Physical Insight Toward Heat Transport and an Improved Electrothermal Modeling Framework for FinFET Architectures," Electron Devices, IEEE Transactions on, Mar. 8, 2012, vol. 59, Issue 5, IEEE, Piscataway, NJ, pp. 1353-1363.

Chaung M-C., et al.,"A Temperature Sensor with a 3 Sigma Inaccuracy of +−2[deg .]C. without Trimming from −50 [deg .]C. to 150[deg.]C. in a 16nm FinFET process," 2013 Proceedings of the ESSCIRC (ESSCIRC), IEEE, Sep. 14, 2015 {Sep. 14, 2015), pp. 271-274, XP032803339 , ISSN: 1930-8833, DOI : 10.1109/ESSCIRC.2015 .7313879 ISBN: 978-1-4799-0643-7 [retrieved on Oct. 30, 2015].

International Search Report and Written Opinion—PCT/US2016/046045—ISA/EPO—dated Oct. 28, 2016.

Lee J-H., "Simulation Study of a New Body-Tied FinFETs (Omega MOSFETs) Using Bulk Si Wafers", School of Electrical Engineering, Seoul National University, SMDL, 2003, 2 Pages.

\* cited by examiner

FIG. 7

TRANSISTOR TEMPERATURE SENSING

I. FIELD

The present disclosure is generally related to transistor temperature sensing.

II. DESCRIPTION OF RELATED ART

Advances in technology have resulted in smaller and more powerful computing devices. For example, a variety of portable personal computing devices, including wireless telephones such as mobile and smart phones, tablets and laptop computers, are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Performance of transistors, such as fin field-effect transistors (finFETs) may be sensitive to temperature changes. For example, a finFET may have localized hot spots which affect performance. To illustrate, the temperature of a junction of the finFET may be higher than the temperature of an area around the finFET. A temperature sensor that detects the temperature of the substrate may underestimate a temperature of the junction of the finFET. To account for the underestimation, an error margin based on a worst-case scenario may be added to the detected temperature. However, the error margin may be unnecessarily high in regular operating conditions leading to over-compensation. For example, a temperature compensation device may perform temperature compensation operations based on a first temperature corresponding to a sum of the detected temperature and the error margin. To illustrate, the temperature compensation device may mark the finFET as unreliable in response to determining that the first temperature fails to satisfy a reliability threshold. A second temperature of the junction of the finFET may be lower than the first temperature and may satisfy the reliability threshold. The temperature compensation operations may over-compensate because of the high error margin, leading to errors.

III. SUMMARY

In a particular aspect, a device includes a source contact, a drain contact, a gate contact, and a body contact. The body contact is electrically coupled to a temperature sensing circuit. The source contact, the drain contact, the gate contact, and the body contact are included in a fin field-effect transistor (finFET).

In another particular aspect, a method includes receiving a first voltage from a body contact of a first fin field-effect transistor (finFET) of a device. The method also includes receiving a second voltage from a second body contact of a second finFET of the device. The method further includes generating an output corresponding to a temperature of the device based on the first voltage and the second voltage.

In another particular aspect, a device includes a first fin field-effect transistor (finFET), a second finFET, and a temperature sensing circuit. The first finFET includes a first body contact. The second finFET includes a second body contact. The temperature sensing circuit includes an amplifier, a first current source, and a second current source. The amplifier includes a first input and a second input. The first input is electrically coupled to the first body contact. The second input is electrically coupled to the second body contact. The first current source is electrically coupled to the first body contact. The second current source is electrically coupled to the second body contact.

Other aspects, advantages, and features of the present disclosure will become apparent after review of the entire application, including the following sections: Brief Description of the Drawings, Detailed Description, and the Claims.

V. DETAILED DESCRIPTION

Systems and methods of transistor temperature sensing are disclosed. A device may include a temperature sensing circuit coupled to one or more transistors. The one or more transistors may include finFETs, bipolar junction transistors (BJTs), or other transistors. For example, the one or more transistors may include a first finFET and a second finFET. A first body contact of the first finFET may be coupled to a first input of an amplifier of the temperature sensing circuit. A second body contact of the second finFET may be coupled to a second input of the amplifier. The temperature sensing circuit may also include a first current source and a second current source. The first current source may be configured to generate a first current. The second current source may be configured to generate a second current. The first current may be distinct from the second current. The first current source may be coupled to the first input of the amplifier. The second current source may be coupled to the second input of the amplifier.

The first body contact may be configured to provide a first voltage to the first input. The first voltage may be proportional to a first temperature of a first junction of the first finFET. The second body contact may be configured to provide a second voltage to the second input. The second voltage may be proportional to a second temperature of a second junction of the first finFET. The first temperature may be substantially the same as the second temperature because the first finFET and the second finFET may have a similar structure and similar operating conditions. The amplifier may generate an output voltage based on a difference between (e.g., a ratio of) the first voltage and the second voltage.

The first finFET and the second finFET may operate as a single finFET. For example, a first source contact of the first finFET and a second source contact of the second finFET may be coupled to first circuitry, a first drain contact of the first finFET and a second drain contact of the second finFET may be coupled to second circuitry, and the first finFET and the second finFET may be configured to provide an electrical path between the first circuitry and the second circuitry responsive to a voltage applied to a first gate contact of the first finFET and a second gate contact of the second finFET.

The temperature sensing circuit may thus generate an output voltage that is proportional to a temperature measured directly from a junction of a finFET. The error margin added to the detected temperature may be reduced or eliminated, resulting in reduced or no over-compensation by a temperature compensation device.

Figure 1:
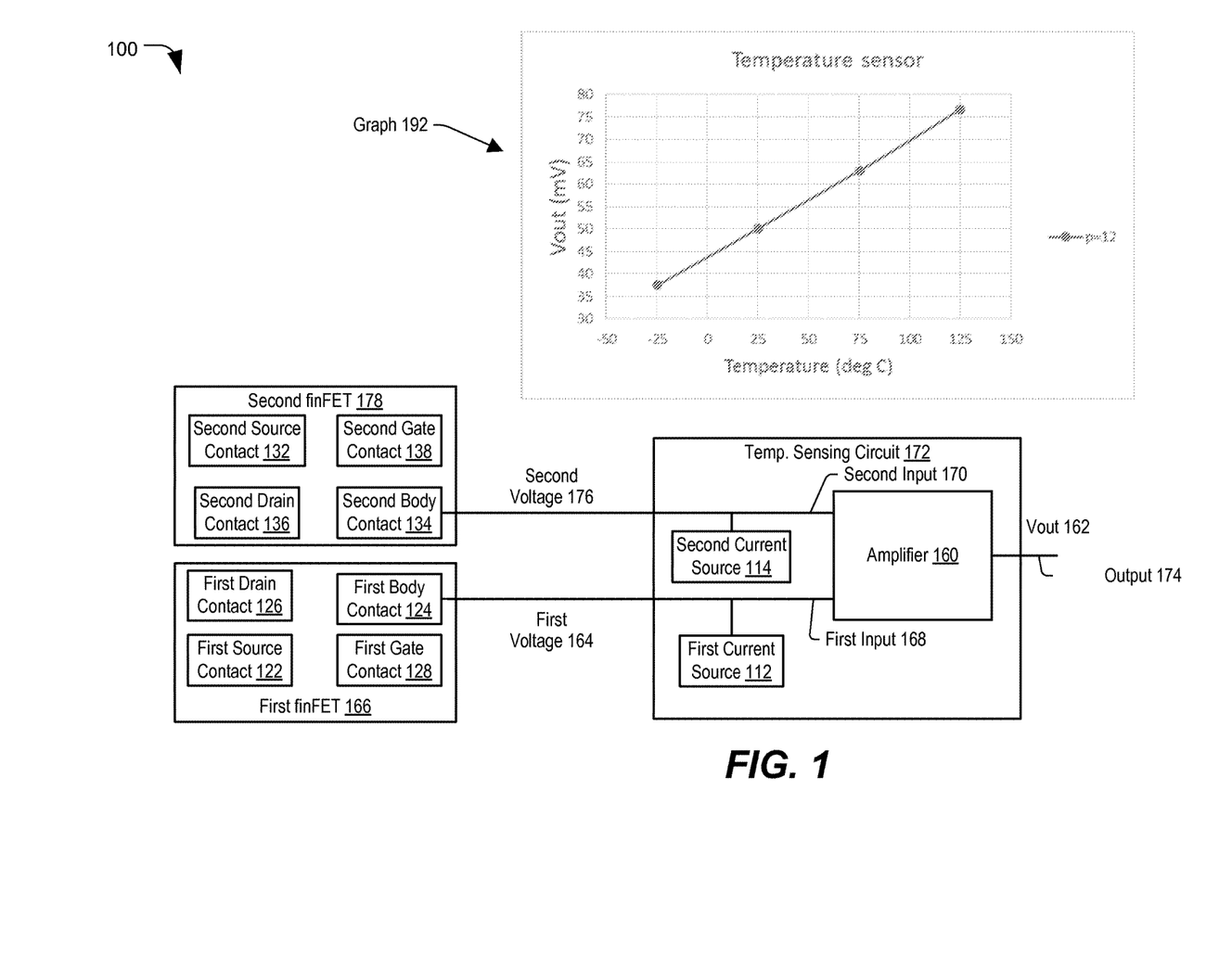
FIG. 1 is a block diagram of a particular illustrative aspect of a device operable to perform finFET temperature sensing.

Referring to FIG. 1, a device is shown and generally designated 100. The device 100 includes a temperature sensing circuit 172 coupled to a first finFET 166 and a second finFET 178. One or more components of the device 100 may be integrated into at least one of a communications device, a fixed location data unit, a mobile location data unit, a mobile phone, a cellular phone, a satellite phone, a computer, a tablet, a portable computer, a desktop computer, a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, or a portable digital video player.

The first finFET 166 may include a first source contact 122, a first body contact 124, a first drain contact 126, a first gate contact 128, or a combination thereof. The first body contact 124 may be configured to output a first voltage 164 that is proportional to a first temperature related to the first finFET 166.

The second finFET 178 may include a second source contact 132, a second body contact 134, a second drain contact 136, a second gate contact 138, or a combination thereof. The second body contact 134 may be configured to output a second voltage 176 that is proportional to a second temperature related to the second finFET 178. The first temperature may be substantially the same as the second temperature because the first finFET 178 and the second finFET 178 may have a similar structure and similar operating conditions. The temperature sensing circuit 172 may include an amplifier 160, a first current source 112, and a second current source 114. The first body contact 124 may be electrically coupled to a first input 168 of the amplifier 160 and to the first current source 112. The second body contact 134 may be electrically coupled to a second input 170 of the amplifier 160 and to the second current source 114. The amplifier 160 may include an output 174.

In a particular aspect, the first finFET 166 and the second finFET 178 may include p-type metal-oxide-semiconductor (PMOS) transistors, and the first current source 112 and the second current source 114 may include n-type metal-oxide-semiconductor (NMOS) transistors, as described with reference to FIGS. 2-3. In an alternate aspect, the first finFET 166 and the second finFET 178 may include NMOS transistors, and the first current source 112 and the second current source 114 may include PMOS transistors, as described with reference to FIGS. 4-5.

The first finFET 166 and the second finFET 178 may be configured to operate as a single transistor. For example, the first source contact 122 may be electrically coupled to the second source contact 132, the first drain contact 126 may be electrically coupled to the second drain contact 136, the first gate contact 128 may be electrically coupled to the second gate contact 138, or a combination thereof. The first source contact 122 and the second source contact 132 may be coupled to first circuitry. The first drain contact 126 and the second drain contact 136 may be coupled to second circuitry. The first finFET 166 and the second finFET 178 may be configured to provide an electrical path between the first circuitry and the second circuitry in response to a voltage applied to the first gate contact 128 and the second gate contact 138.

The first current source 112 may have a first physical characteristic (e.g., a first fin dimension, a first channel dimension, or both) that is distinct from (e.g., greater than or lower than) a second physical characteristic (e.g., a second fin dimension, a second channel dimension, or both) of the second current source 114. For example, the first current source 112 may include a first channel region between a first source of the first current source 112 and a first drain of the first current source 112. The first channel region may have a first channel size (e.g., first height, first width, and first depth). The second current source 114 may include a second channel region between a second source of the second current source 114 and a second drain of the second current source 114. The second channel region may have a second channel size (e.g., second height, second width, and second depth). The first channel size may be distinct from the second channel size. For example, the first height may be distinct from the second height, the first width may be distinct from the second width, the first depth may be distinct from the second depth, or a combination thereof.

The first current source 112 may be configured to supply a first current to the first finFET 166. The second current source 114 may be configured to supply a second current to the second finFET 178. The first current and the second current may have a predetermined current ratio that is based on first physical characteristics (e.g., the first channel size) of the first current source 112 and second physical characteristics (e.g., the second channel size) of the second current source 114.

During operation, the first current source 112 may provide a first current to a first junction of the first finFET 166. The first junction may be formed between a first n-type region and a first p-type region of the first finFET 166. The first n-type region and the first p-type region may form a first diode. The first body contact 124 may, responsive to the first current, provide the first voltage 164 to the first input 168. The first voltage 164 may be proportional to a first temperature of the first junction because the first n-type region and the first p-type region form a diode. The second current source 114 may provide a second current to a second junction of the second finFET 178. The second junction may be formed between a second n-type region and a second p-type region of the second finFET 178. The second n-type region and the second p-type region may form a second diode. The first finFET 166 and the second finFET 178 may be substantially identical. The first diode may operate similarly to the second diode. The second body contact 134 may, responsive to the second current, provide the second voltage 176 to the second input 170. The second voltage 176 may be proportional to a second temperature of the second junction because the second n-type region and the second p-type region form a diode. The first voltage 164 may be proportional to a first temperature related to the first finFET 166, and the second voltage 176 may be proportional to a second temperature related to the second finFET 178. For example, the first temperature may correspond to a temperature of the first junction of the first finFET 166 and the second temperature may correspond to a temperature of the second junction of the second finFET 178. The first temperature may be substantially the same as the second temperature because the first finFET 166 and the second finFET 178 may have a similar structure and similar operating conditions.

The amplifier 160 may compare the first voltage 164 and the second voltage 176 to generate an output voltage (Vout) 162. Vout 162 may correspond to a difference between (or a ratio of) the first voltage 164 and the second voltage 176. For example, Vout 162 may correspond to (kT/q) ln (p). In this example, p corresponds to a current ratio (e.g., 12) of the first current and the second current, T corresponds to the first temperature related to the first finFET 166, the second temperature related to the second finFET 178, or both, q corresponds to an electron charge (e.g., $1.602 \times 10^{-9}$ coulombs), and k is a constant (e.g., Boltzmann constant=$1.38 \times 10^{-23}$ joules/kelvin). Vout 162 may correspond to a temperature of the device 100. For example, Vout 162 may correspond to a first temperature of a first junction of the first finFET 166, a second temperature of a second junction of the second finFET 178, or both. The first temperature may be substantially the same as the second temperature because the first finFET 166 and the second finFET 178 have a similar structure and similar operating conditions. In a particular implementation, the difference between (or the ratio of) the first voltage 164 and the second voltage 176 may increase as the first temperature increases and the second temperature increase. For example, the first voltage 164 and the second voltage 176 may have a first difference (e.g., 59.5 milli-Volts (mV)) for the first temperature (e.g., 300 degrees Kelvin (K)) of the first junction of the first finFET 166 and the second temperature (e.g., 300 degrees K) of the second junction of the second finFET 178. The first voltage 164 and the second voltage 176 may have a second difference (e.g., 76 mV) for the first temperature (e.g., 383 degrees K) and the second temperature (e.g., 383 degrees K). In this implementation, Vout 162 may increase as the first temperature and the second temperature increase. FIG. 1 also includes graph 192. The graph 192 illustrates exemplary values of Vout 162 corresponding to the first temperature and the second temperature. For example, Vout 162 may correspond to approximately 64 mV when the first temperature and the second temperature are approximately 75 degrees Celsius (C). Vout 162 may correspond to approximately 77 mV when the first temperature and the second temperature are approximately 125 degrees C.

The device 100 may thus detect a temperature related to a junction of a finFET. An error margin that is added to the detected temperature may be reduced or eliminated because the detected temperature is measured directly from the junction of the finFET.

Figure 2:
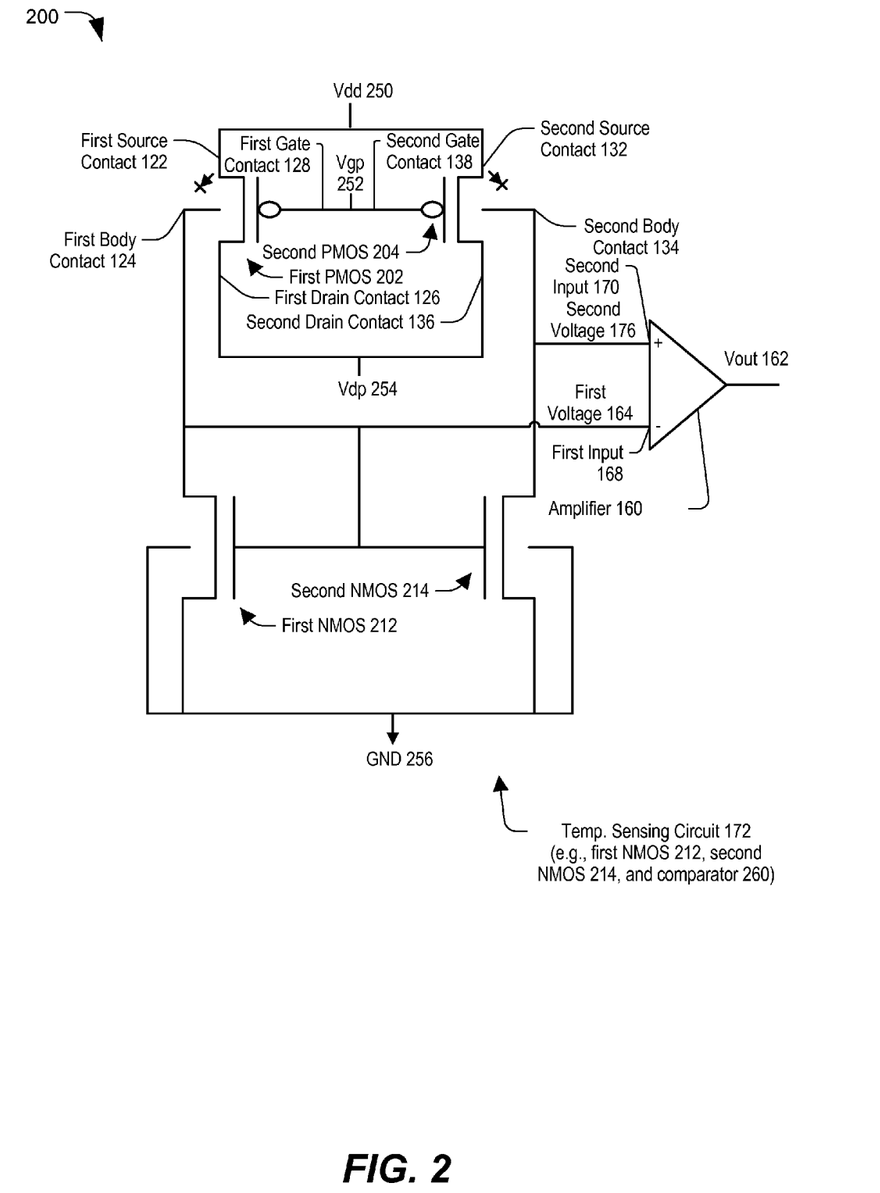
FIG. 2 is a diagram of another aspect of the device of FIG. 1.

Referring to FIG. 2, a diagram of a device is shown and generally designated 200. The device 200 may correspond to the device 100 of FIG. 1.

The device 200 includes a first PMOS transistor 202 and a second PMOS transistor 204. The first PMOS transistor 202 may correspond to the first finFET 166 of FIG. 1. The second PMOS transistor 204 may correspond to the second finFET 178 of FIG. 1. The first PMOS transistor 202 may include the first source contact 122, the first body contact 124, the first drain contact 126, the first gate contact 128, or a combination thereof. The second PMOS transistor 204 may include the second source contact 132, the second body contact 134, the second drain contact 136, and the second gate contact 138.

The first PMOS transistor 202 and the second PMOS transistor 204 may be configured to operate as a single PMOS transistor. For example, an input voltage supply (Vdd) 250 may correspond to a source of the PMOS transistor. The first source contact 122 and the second source contact 132 may be coupled to Vdd 250. A gate voltage supply (Vgp) 252 may correspond to a gate of the PMOS transistor. The first gate contact 128 and the second gate contact 138 may be coupled to Vgp 252. A drain voltage supply (Vdp) 254 may correspond to the drain of the PMOS transistor. The first drain contact 126 and the second drain contact 136 may be coupled to Vdp 254.

The device 200 may also include the temperature sensing circuit 172. The temperature sensing circuit 172 may include a first current source, a second current source, and the amplifier 160. The first current source may include a first n-type metal-oxide-semiconductor (NMOS) transistor 212, and the second current source may include a second NMOS transistor 214. The amplifier 160 may operate as a differential amplifier. For example, the amplifier 160 may be configured to generate Vout 162 that is proportional to a difference between the first voltage 164 of the first input 168 and the second voltage 176 of the second input 170. In a particular implementation, the amplifier 160 may amplify the difference between the first voltage 164 and the second voltage 176.

The first body contact 124 may be coupled to a first drain of the first NMOS transistor 212, a first gate of the first NMOS transistor 212, a second gate of the second NMOS transistor 214, the first input 168 of the amplifier 160, or a combination thereof. The first body contact 124 may be configured to output a first voltage that is proportional to a first temperature related to the first PMOS transistor 202. The first temperature may be related to a first junction of the first PMOS transistor 202.

The second body contact 134 may be coupled to a second drain of the second NMOS transistor 214, the second input 170 of the amplifier 160, or both. The second body contact 134 may be configured to output a second voltage that is proportional to a second temperature related to the second PMOS transistor 204. The second temperature may be related to a second junction of the second PMOS transistor 204. The first temperature may be substantially the same as the second temperature because the first PMOS transistor 202 and the second PMOS transistor 204 have a similar structure and similar operating conditions. A first source contact of the first NMOS transistor 212, a second source contact of the second NMOS transistor 214, a first body contact of the first NMOS transistor 212, a second body contact of the second NMOS transistor 214, or a combination thereof, may be coupled to a ground voltage supply (GND) 256.

During operation, the first NMOS transistor 212 may provide a first current to a first junction of the first PMOS transistor 202. The first junction may be formed between a first p-type region (e.g., the first drain contact 126) and a first n-type region (e.g., a first channel region) of the first PMOS transistor 202. The first body contact 124 may, responsive to the first current, provide the first voltage 164 to the first input 168. The first voltage 164 may be based on a first temperature of a first junction of the first PMOS transistor 202. The second NMOS transistor 214 may provide a second current to a second junction of the second PMOS transistor 204. The second junction may be formed between a second p-type region (e.g., the second drain contact 136) and a second n-type region (e.g., a second channel region) of the second PMOS transistor 204. The first body contact 124 may, responsive to the first current, provide the first voltage 164 to the first input 168. The first voltage 164 may be based on a first temperature of a first junction (e.g., the first channel region) of the first PMOS transistor 202. The second body contact 134 may, responsive to the second current, provide the second voltage 176 to the second input 170. The second voltage 176 may be based on a second temperature of a second junction (e.g., the second channel region) of the second PMOS transistor 204. The first temperature may be the same as the second temperature. The amplifier 160 may compare the first voltage 164 and the second voltage 176 to generate Vout 162, as described with reference to FIG. 1.

In a particular implementation, the difference between (or the ratio of) the first voltage 164 and the second voltage 176 may increase as a first temperature of a first junction of the first PMOS transistor 202 and a second temperature of a second junction of the second PMOS transistor 204 increase, as described with reference to FIG. 1. The first PMOS transistor 202 (e.g., the first channel region), the second PMOS transistor 204 (e.g., the second channel region), or both, may include local hot spots that have a higher temperature than nearby regions. In this implementation, Vout 162 may increase as the first temperature and the second temperature increase.

Figure 3:
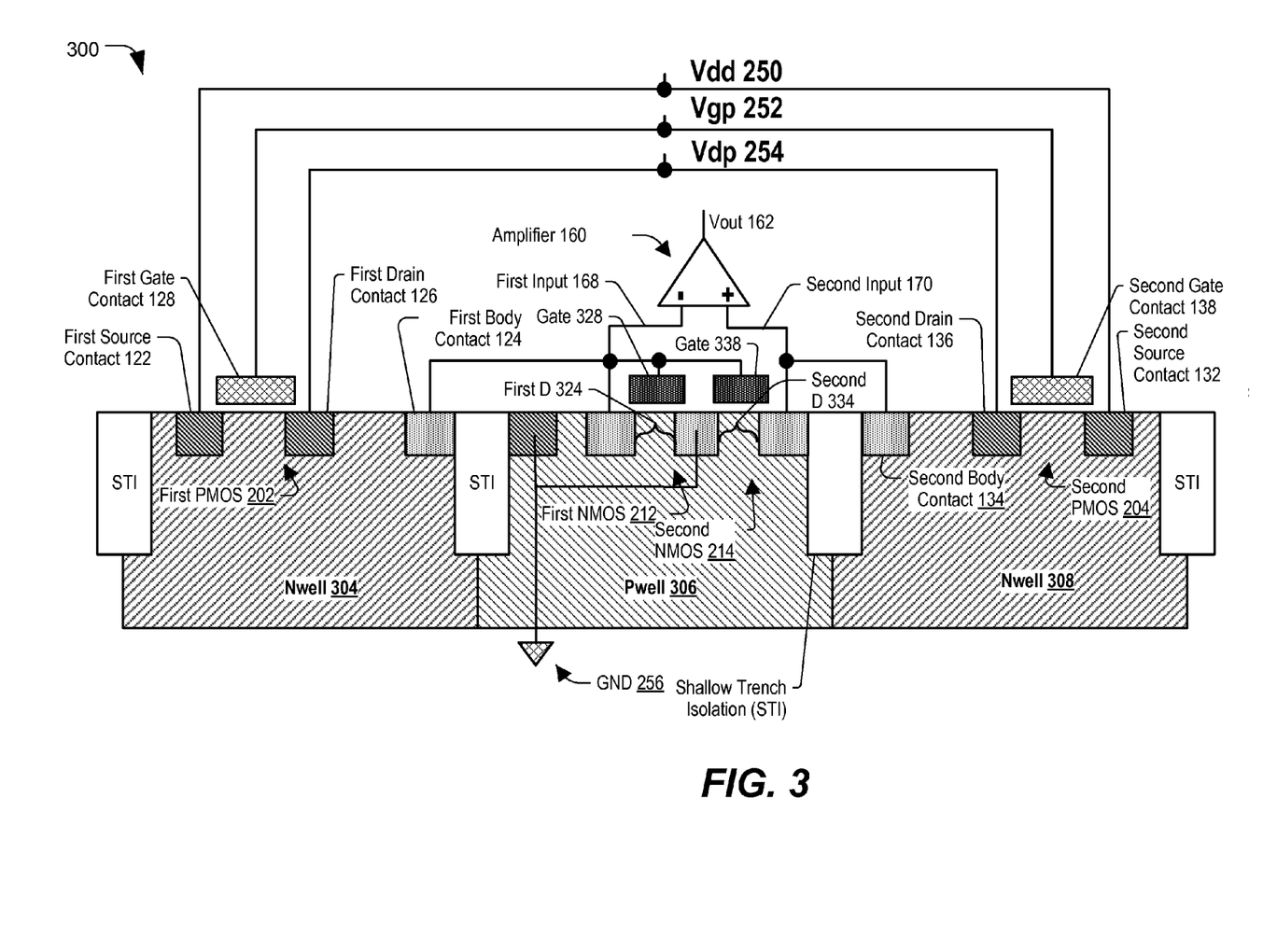
FIG. 3 is a diagram of another aspect of the device of FIG. 1.

Referring to FIG. 3, a diagram of a device is shown and generally designated 300. The device 300 may correspond to the device 100 of FIG. 1, the device 200 of FIG. 2, or both. The diagram of FIG. 3 schematically represents structure corresponding to the device 200 of FIG. 2.

The device 300 may include a first n-type well (Nwell) 304, a p-type well (Pwell) 306, a second Nwell 308, or a combination thereof. In a particular implementation, the first Nwell 304, the Pwell 306, the second Nwell 308, or a combination thereof, may be formed on a single substrate (e.g., a p-type substrate). The first Nwell 304, the second Nwell 308, or both, may be formed by implanting or diffusing n-type dopants in one or more portions of the substrate. The first source contact 122, the first drain contact 126, the first body contact 124, or a combination thereof, may be implanted in or coupled to the first Nwell 304. The second source contact 132, the second body contact 134, the second drain contact 136, or a combination thereof, may be implanted in or coupled to the second Nwell 308. A first source contact of the first NMOS transistor 212, a first drain contact of the first NMOS transistor 212, a second source contact of the second NMOS transistor 214, a second drain contact of the second NMOS transistor 214, or a combination thereof, may be implanted in or coupled to the Pwell 306.

The first source contact 122 and the second source contact 132 may be coupled to Vdd 250. The first gate contact 128 and the second gate contact 138 may be coupled to Vgp 252. The first drain contact 126 and the second drain contact 136 may be coupled to Vdp 254. The first body contact 124 may be coupled to a first drain of the first NMOS transistor 212, a gate 328 of the first NMOS transistor 212, a gate 338 of the second NMOS transistor 214, the first input 168 of the amplifier 160, or a combination thereof. The second body contact 134 may be coupled to a second drain of the second NMOS transistor 214, the second input 170 of the amplifier 160, or both.

The first NMOS transistor 212 may have first physical characteristics (e.g., first channel dimensions, first fin dimensions, or both). The second NMOS transistor 214 may have second physical characteristics (e.g., second channel dimension, second fin dimensions or both). A first dimension (D) 324 (e.g., a channel width or a fin width) of at least one of the first physical characteristics may differ from a second D 334 of the second physical characteristics. Having distinct physical characteristics may enable the first NMOS transistor 212 and the second NMOS transistor 214 to generate distinct currents. For example, the first NMOS transistor 212 may generate a first current that has a first magnitude. The second NMOS transistor 214 may generate a second current that has a second magnitude. The first magnitude may be distinct from the second magnitude. The first current and the second current may have a current ratio that is determined based on the first channel size and the second channel size.

The first nwell 304 (e.g., a first channel region), the second nwell 308 (e.g., a second channel region), or both, may include local hot spots that have a higher temperature than nearby regions. The first voltage 164 of FIG. 1 may be based on a first temperature of the first nwell 304. The second voltage 176 of FIG. 1 may be based on a second temperature of the second nwell 308. The first temperature may be the same as the second temperature. The first voltage 164 may be distinct from the second voltage 176 because the first magnitude of the first current differs from the second magnitude of the second current. Vout 162 may be based on the first voltage 164 and the second voltage 176, as described with reference to FIG. 1. Vout 162 may thus indicate the first temperature of the first nwell 304 and the second temperature of the second nwell 308.

The device 300 may indicate a temperature of a channel region of a transistor that may include local hot spots in the channel region. An error margin that is added to the detected temperature may be reduced or eliminated because the detected temperature is measured directly from a junction of the transistor. As a result, over-compensation by a temperature compensation device may be reduced or eliminated. For example, the temperature compensation device may mark a transistor as unreliable or reliable based on the detected temperature of the junction of the transistor, as compared to an estimated temperature that is determined based on a high error margin.

Figure 4:
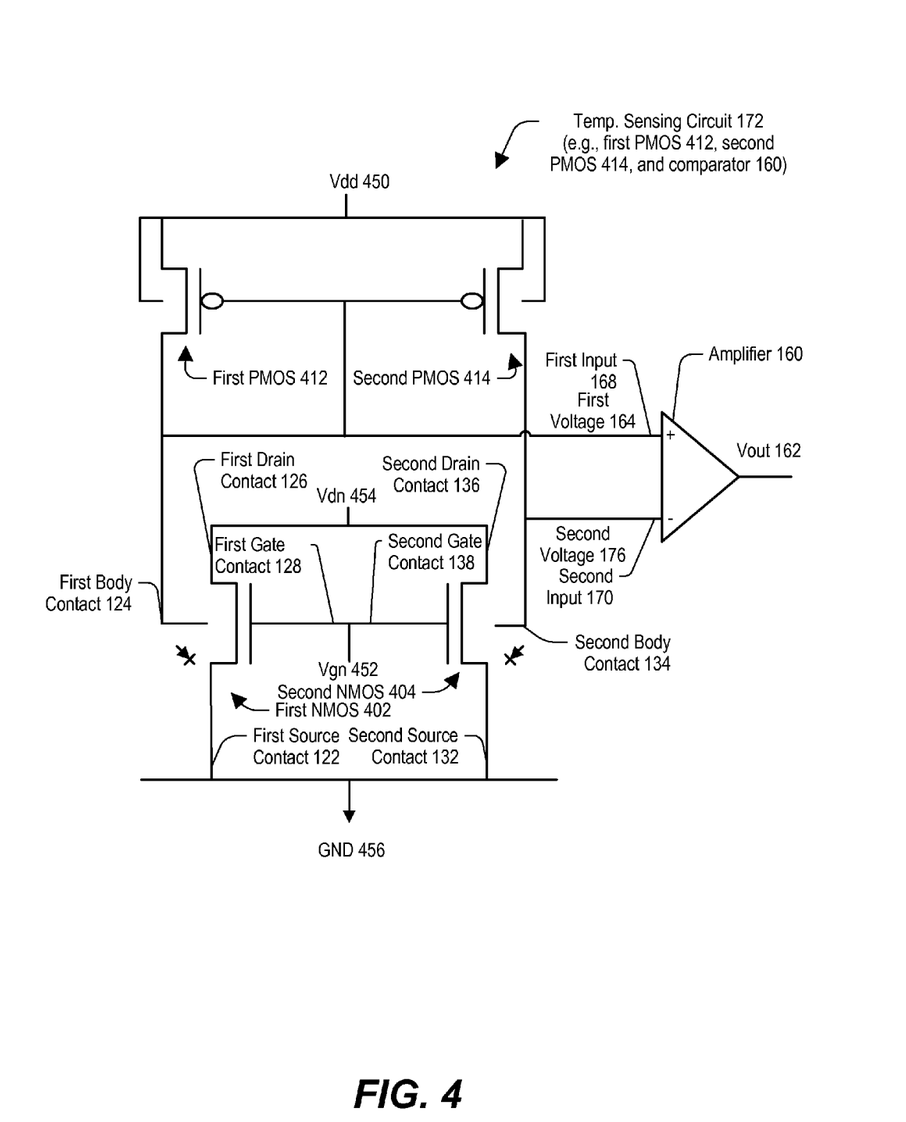
FIG. 4 is a diagram of another aspect of the device of FIG. 1.

Referring to FIG. 4, a diagram of a device is shown and generally designated 400. The device 400 may correspond to the device 100 of FIG. 1.

The device 400 includes a first NMOS transistor 402 and a second NMOS transistor 404. The first NMOS transistor 402 may correspond to the first finFET 166 of FIG. 1. The second NMOS transistor 404 may correspond to the second finFET 178 of FIG. 1. The first NMOS transistor 402 may include the first source contact 122, the first body contact 124, the first drain contact 126, the first gate contact 128, or a combination thereof. The second NMOS transistor 404 may include the second source contact 132, the second body contact 134, the second drain contact 136, and the second gate contact 138.

The first NMOS transistor 402 and the second NMOS transistor 404 may be configured to operate as a single NMOS transistor. For example, a ground voltage supply (GND) 456 may correspond to a source of the NMOS transistor. The first source contact 122 and the second source contact 132 may be coupled to GND 456. A gate voltage supply (Vgn) 452 may correspond to a gate of the NMOS transistor. The first gate contact 128 and the second gate contact 138 may be coupled to Vgn 452. A drain voltage supply (Vdn) 454 may correspond to the drain of the NMOS transistor. The first drain contact 126 and the second drain contact 136 may be coupled to Vdn 454.

The device 400 may also include the temperature sensing circuit 172. The temperature sensing circuit 172 may include a first current source, a second current source, and the amplifier 160. The first current source may include a first PMOS transistor 412, and the second current source may include a second PMOS transistor 414.

The first body contact 124 may be coupled to a first drain of the first PMOS transistor 412, a first gate of the first PMOS transistor 412, a second gate of the second PMOS transistor 414, the first input 168 of the amplifier 160, or a combination thereof. The first body contact 124 may be configured to output a first voltage that is proportional to a first temperature related to the first NMOS transistor 402. The first temperature may be related to a first junction of the first NMOS transistor 402.

The second body contact 134 may be coupled to a second drain of the second PMOS transistor 414, the second input 170 of the amplifier 160, or both. The second body contact 134 may be configured to output a second voltage that is proportional to a second temperature related to the second NMOS transistor 404. The second temperature may be related to a second junction of the second NMOS transistor 404. The first temperature may be substantially the same as the second temperature because the first NMOS transistor 402 and the second NMOS transistor 404 have a similar structure and similar operating conditions. A first source contact of the first PMOS transistor 412, a second source contact of the second PMOS transistor 414, a first body contact of the first PMOS transistor 412, a second body contact of the second PMOS transistor 414, or a combination thereof, may be coupled to an input voltage supply (Vdd) 450.

During operation, the first PMOS transistor 412 may provide a first current to a first junction of the first NMOS transistor 402. The first junction may be formed between a first n-type region (e.g., the first drain contact 126) and a first p-type region (e.g., a first channel region) of the first NMOS transistor 402. The first body contact 124 may, responsive to the first current, provide the first voltage 164 to the first input 168. The first voltage 164 may be based on a first temperature of a first junction of the first NMOS transistor 402. The second PMOS transistor 414 may provide a second current to a second junction of the second NMOS transistor 404. The second junction may be formed between a second n-type region (e.g., the second drain contact 136) and a second p-type region (e.g., a second channel region) of the second NMOS transistor 404. The first body contact 124 may, responsive to the first current, provide the first voltage 164 to the first input 168. The first voltage 164 may be based on a first temperature of a first junction (e.g., the first channel region) of the first NMOS transistor 402. The second body contact 134 may, responsive to the second current, provide the second voltage 176 to the second input 170. The second voltage 176 may be based on a second temperature of a second junction (e.g., the second channel region) of the second NMOS transistor 404. The first temperature may be the same as the second temperature. The amplifier 160 may compare the first voltage 164 and the second voltage 176 to generate Vout 162, as described with reference to FIG. 1.

In a particular implementation, the difference between (or the ratio of) the first voltage 164 and the second voltage 176 may increase as a first temperature of a first junction of the first NMOS transistor 402 and a second temperature of a second junction of the second NMOS transistor 404 increase, as described with reference to FIG. 1. The first NMOS transistor 402 (e.g., the first channel region), the second NMOS transistor 404 (e.g., the second channel region), or both, may include local hot spots that have a higher temperature than nearby regions. In this implementation, Vout 162 may increase as the first temperature and the second temperature increase.

Figure 5:
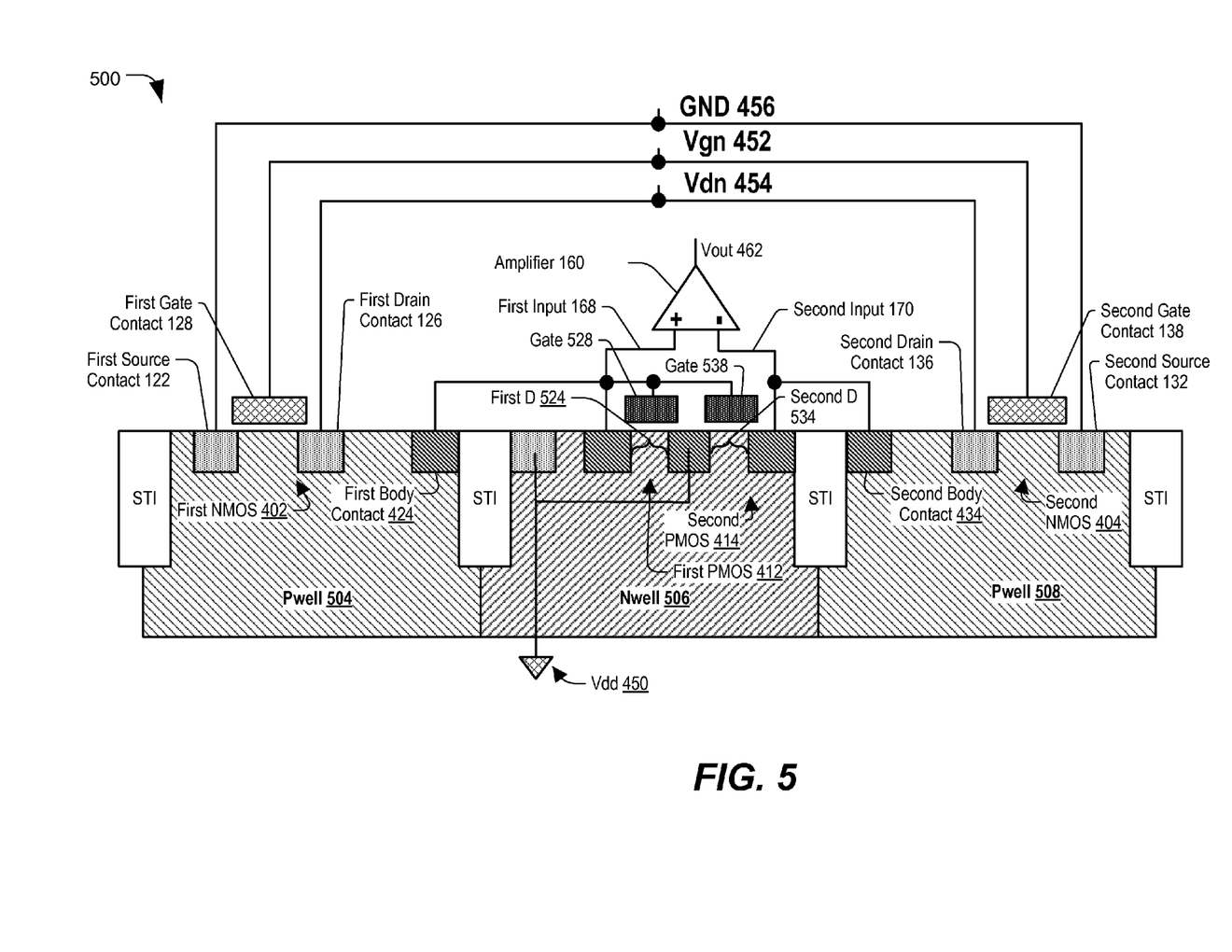
FIG. 5 is a diagram of another aspect of the device of FIG. 1.

Referring to FIG. 5, a diagram of a device is shown and generally designated 500. The device 500 may correspond to the device 100 of FIG. 1, the device 400 of FIG. 4, or both. The diagram of FIG. 5 schematically represents structure corresponding to the device 400 of FIG. 4.

The device 500 may include a first Pwell 504, an Nwell 506, a second Pwell 508, or a combination thereof. In a particular implementation, the first Pwell 504, the Nwell 506, the second Pwell 508, or a combination thereof, may be formed on a single substrate (e.g., a p-type substrate). The Nwell 506 may be formed by implanting or diffusing n-type dopants in one or more portions of the substrate. The first source contact 122, the first drain contact 126, the first body contact 124, or a combination thereof, may be implanted in or coupled to the first Pwell 504. The second source contact 132, the second body contact 134, the second drain contact 136, or a combination thereof, may be implanted in or coupled to the second Pwell 508. A first source contact of the first PMOS transistor 412, a first drain contact of the first PMOS transistor 412, a second source contact of the second PMOS transistor 414, a second drain contact of the second PMOS transistor 414, or a combination thereof, may be implanted in or coupled to the Nwell 506.

The first source contact 122 and the second source contact 132 may be coupled to GND 456. The first gate contact 128 and the second gate contact 138 may be coupled to Vgn 452. The first drain contact 126 and the second drain contact 136 may be coupled to Vdn 454. The first body contact 124 may be coupled to a first drain of the first PMOS transistor 412, a gate 528 of the first PMOS transistor 412, a gate 538 of the second PMOS transistor 414, the first input 168 of the amplifier 160, or a combination thereof. The second body contact 134 may be coupled to a second drain of the second PMOS transistor 414, the second input 170 of the amplifier 160, or both.

The first PMOS transistor 412 may have first physical characteristics (e.g., first channel dimensions, first fin dimensions, or both). The second PMOS transistor 414 may have second physical characteristics (e.g., second channel dimension, second fin dimensions or both). A first dimension (D) 524 (e.g., a channel width or a fin width) of at least one of the first physical characteristics may differ from a second D 534 of the second physical characteristics. Having distinct physical characteristics may enable the first PMOS transistor 412 and the second PMOS transistor 414 to generate distinct currents. For example, the first PMOS transistor 412 may generate a first current that has a first magnitude. The second PMOS transistor 414 may generate a second current that has a second magnitude. The first magnitude may be distinct from the second magnitude. The first current and the second current may have a current ratio that is determined based on the first channel size and the second channel size.

The first pwell 504 (e.g., a first channel region), the second pwell 508 (e.g., a second channel region), or both, may include local hot spots that have a higher temperature than nearby regions. The first voltage 164 of FIG. 1 may be based on a first temperature of the first pwell 504. The second voltage 176 of FIG. 1 may be based on a second temperature of the second pwell 508. The first temperature may be the same as the second temperature. The first voltage 164 may be distinct from the second voltage 176 because the first magnitude of the first current differs from the second magnitude of the second current. Vout 162 may be based on the first voltage 164 and the second voltage 176, as described with reference to FIG. 1. Vout 162 may thus indicate the first temperature of the first pwell 504 and the second temperature of the second pwell 508.

The device 500 may indicate a temperature of a channel region of a transistor that may include local hot spots in the channel region. An error margin that is added to the detected temperature may be reduced or eliminated because the detected temperature is measured directly from a junction of the transistor. As a result, over-compensation by a temperature compensation device may be reduced or eliminated. For example, the temperature compensation device may mark a transistor as unreliable or reliable based on the detected temperature of the junction of the transistor, as compared to an estimated temperature that is determined based on a high error margin.

Figure 6:
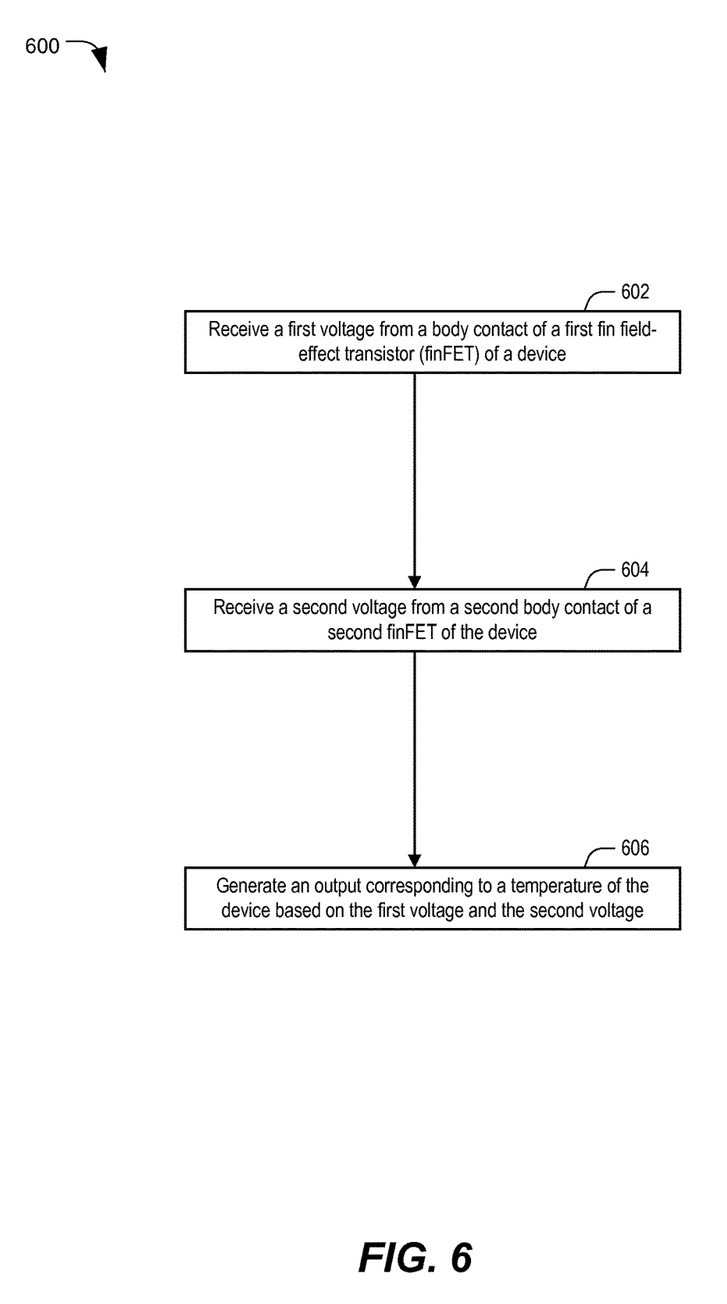
FIG. 6 is a flow chart of a particular illustrative aspect of a method of finFET temperature sensing.

Referring to FIG. 6, a particular illustrative aspect of a method of finFET temperature sensing is disclosed and generally designated 600. The method 600 may be performed by one or more of the devices 100-500 of FIGS. 1-5. For example, the method 600 may be performed by the temperature sensing circuit 172 of FIGS. 1-5.

The method 600 includes receiving a first voltage from a body contact of a first fin field-effect transistor (finFET) of a device, at 602. For example, the temperature sensing circuit 172 may receive the first voltage 164 from the first body contact 124 of the first finFET 166, as described with reference to FIG. 1.

The method 600 also includes receiving a second voltage from a second body contact of a second finFET of the device, at 604. For example, the temperature sensing circuit 172 may receive the second voltage 176 from the second body contact 134 of the second finFET 178, as described with reference to FIG. 1.

The method 600 further includes generating an output corresponding to a temperature of the device based on the first voltage and the second voltage, at 606. For example, the temperature sensing circuit 172 may generate Vout 162 based on the first voltage 164 and the second voltage 176, as described with reference to FIG. 1. Vout 162 may correspond to a temperature of the device 100, as described with reference to FIG. 1.

The method 600 may thus enable detection of a temperature related to a junction of a finFET. An error margin that is added to the detected temperature may be reduced or eliminated because the detected temperature is measured directly from the junction of the finFET. As a result, over-compensation by a temperature compensation device may be reduced or eliminated. For example, the temperature sensing circuit 172 may provide Vout 162 to a temperature compensation device. The temperature compensation device may mark a transistor as unreliable or reliable based on the detected temperature of the junction of the transistor, as compared to an estimated temperature that is determined based on a high error margin.

The finFET may have a narrow fin width (e.g., less than 0.3 nanometers). A threshold voltage of the finFET may be independent of body bias. For example, the threshold voltage of the finFET may be substantially independent of whether a body contact of the finFET provides a voltage to an input of a temperature sensing circuit. The finFET may thus continue to participate in other circuits while being coupled to the temperature sensing circuit. For example, a source of the finFET may be coupled to first circuitry, a drain of the finFET may be coupled to second circuitry, and the finFET may provide an electrical path between the first circuitry and the second circuitry responsive to a voltage applied to a gate of the finFET. The temperature sensing circuit may thus detect a temperature of the finFET during operation of the finFET.

The method 600 of FIG. 6 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method 600 of FIG. 6 can be performed by a processor that executes instructions, as described with respect to FIG. 7.

Figure 7:
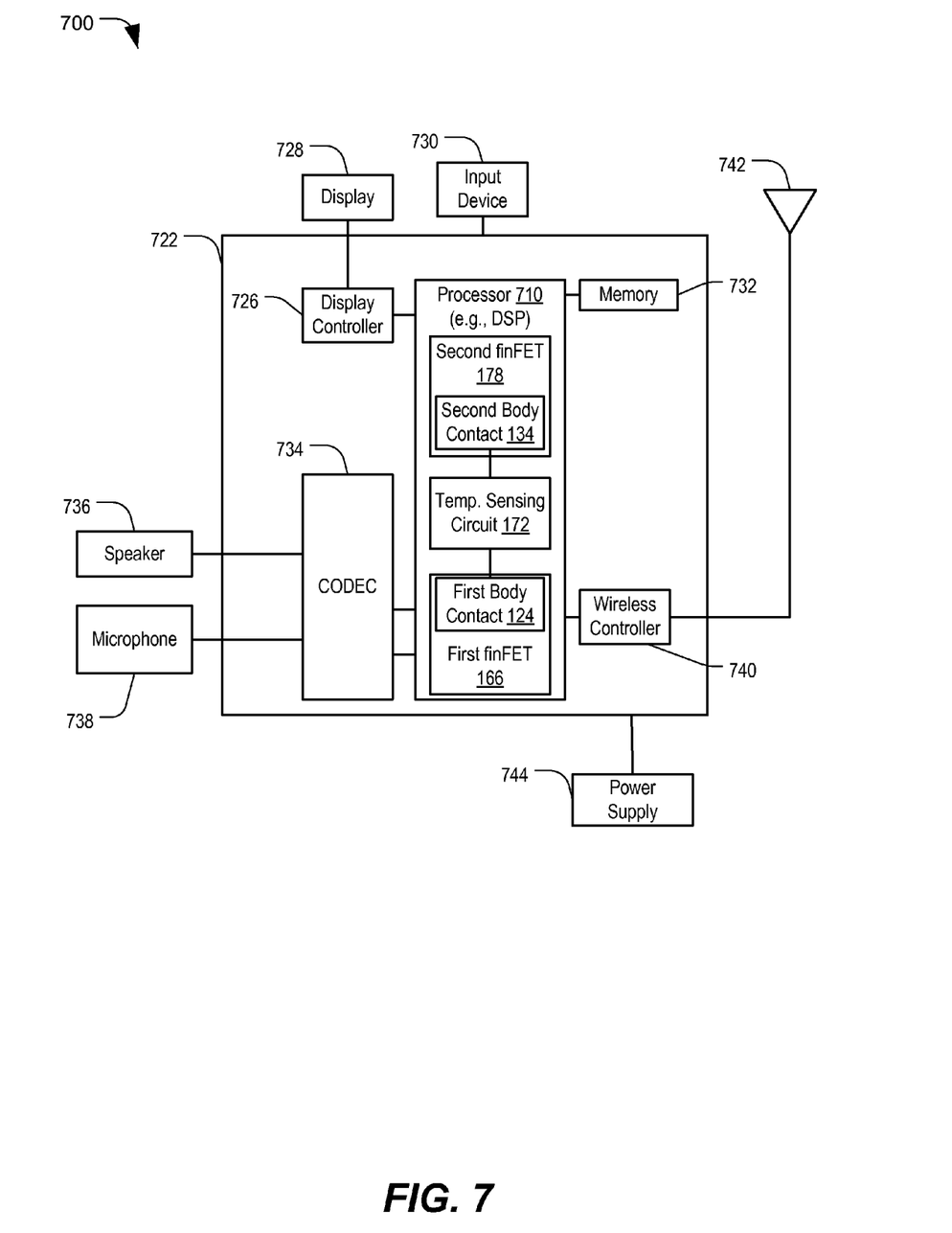
FIG. 7 is a block diagram of portable device operable to perform finFET temperature sensing.

Referring to FIG. 7, a block diagram of a particular illustrative aspect of a wireless communication device is depicted and generally designated 700. The wireless communication device 700 includes a processor 710, such as a digital signal processor (DSP), coupled to a memory 732 (e.g., a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art). One or more components of the communication device 700 may include the temperature sensing circuit 172 coupled to the first finFET 166, the second finFET 178, or both. For example, the processor 710 may include the temperature sensing circuit 172 coupled to the first finFET 166, the second finFET 178, or both.

The memory 732 may include a non-transient computer-readable storage medium storing computer-readable instructions that are executable by the processor 710 to perform one or more operations described with reference to devices, systems, or methods of FIGS. 1-6. For example, the operations may include receiving the first voltage 164 from the first body contact 124, receiving the second voltage 176 from the second body contact 134, and generating Vout 162 based on the first voltage 164 and the second voltage 176, as described with reference to FIG. 1.

FIG. 7 also shows a display controller 726 that is coupled to the processor 710 and to a display 728. A coder/decoder (CODEC) 734 may also be coupled to the processor 710. A speaker 736 and a microphone 738 may be coupled to the CODEC 734.

FIG. 7 also indicates that a wireless controller 740 may be coupled to the processor 710 and may be further coupled to an antenna 742. In a particular aspect, the processor 710, the display controller 726, the memory 732, the CODEC 734, and the wireless controller 740 are included in a system-in-package or system-on-chip device 722. In a particular aspect, an input device 730 and a power supply 744 are coupled to the system-on-chip device 722. Moreover, in a particular aspect, as illustrated in FIG. 7, the display 728, the input device 730, the speaker 736, the microphone 738, the antenna 742, and the power supply 744 are external to the system-on-chip device 722. However, each of the display 728, the input device 730, the speaker 736, the microphone 738, the antenna 742, and the power supply 744 may be coupled to a component of the system-on-chip device 722, such as an interface or a controller.

In conjunction with the described aspects, an apparatus is disclosed that may include means for receiving a first voltage from a body contact of a first fin field-effect transistor (finFET) of a device. For example, the means for receiving a first voltage may include the first input 168 of FIG. 1, one or more other devices or circuits configured to receive a first voltage, or any combination thereof.

The apparatus may also include means for receiving a second voltage from a second body contact of a second finFET of the device. For example, the means for receiving a second voltage may include the second input 170 of FIG. 1, one or more other devices or circuits configured to receive a second voltage, or any combination thereof.

The apparatus may further include means for comparing the first voltage and the second voltage to generate an output voltage corresponding to a temperature of the device. For example, the means for comparing may include the amplifier 160 of FIG. 1, one or more other devices or circuits configured to compare, or any combination thereof.

Although one or more of FIGS. 1-7 may illustrate systems, devices, and/or methods according to the teachings of the disclosure, the disclosure is not limited to these illustrated systems, devices, and/or methods. Aspects of the disclosure may be suitably employed in any device that includes integrated circuitry including memory, a processor, and on-chip circuitry.

One or more functions or components of any of FIGS. 1-7 as illustrated or described herein may be combined with one or more other portions of another of FIGS. 1-7. Accordingly, no single aspect described herein should be construed as limiting and aspects of the disclosure may be suitably combined without departing form the teachings of the disclosure.

Those of skill would further appreciate that the various illustrative logical blocks, configurations, modules, circuits, and algorithm steps described in connection with the aspects disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal A storage device is not a signal.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. A device comprising:
    a first fin field-effect transistor (finFET) comprising:
        a first source contact;
        a first drain contact; and
        a first body contact electrically coupled to a temperature sensing circuit, wherein the first body contact responsive to a first current provides a first voltage to the temperature sensing circuit, wherein at least a portion of the first source contact, the first drain contact, and the first body contact are formed in a first well of the first finFET, and wherein a first current source with first physical characteristics provides the first current; and
    a second finFET comprising:
        a second source contact;
        a second drain contact; and
        a second body contact electrically coupled to the temperature sensing circuit, wherein the second body contact responsive to a second current provides a second voltage to the temperature sensing circuit, wherein a second current source with second physical characteristics distinct from the first physical characteristics provides the second current, wherein at least a portion of the second source contact, the second drain contact and the second body contact are formed in a second well of the second finFET, and wherein the temperature sensing circuit generates an output voltage based on a difference between the first voltage and the second voltage.

2. The device of claim 1, further comprising:
    a first gate contact of the first finFET; and
    a second gate contact of the second finFET, the second gate contact electrically coupled to the first gate contact.

3. The device of claim 2, wherein the first finFET and the second finFET operate as a single finFET.

4. The device of claim 1, wherein the first finFET includes a first p-type metal-oxide-semiconductor (PMOS) transistor and the second finFET includes a second PMOS transistor.

5. The device of claim 1, wherein the first current source includes a first n-type metal-oxide-semiconductor (NMOS) transistor and the second current source includes a second NMOS transistor.

6. The device of claim 2, wherein the first source contact and the second source contact are coupled to a first circuitry, wherein the first drain contact and the second drain contact are coupled to a second circuitry, and wherein the first finFET and the second finFET are configured to provide an electrical path between the first circuitry and the second circuitry responsive to the first voltage applied to the first gate contact and the second gate contact.

7. The device of claim 1, wherein the first voltage is proportional to a first temperature related to the first finFET.

8. The device of claim 1, wherein the temperature sensing circuit includes an amplifier that is configured to output the second voltage based at least in part on the first voltage.

9. The device of claim 2, wherein the first source contact is coupled to a first circuitry, the first drain contact is coupled to a second circuitry, and wherein the first finFET is configured to provide an electrical path between the first circuitry and the second circuitry responsive to the first voltage applied to the first gate contact.

10. The device of claim 1, wherein the first current and the second current have a current ratio based on a channel size of the first current source and the channel size of the second current source.

11. The device of claim 1, wherein the first voltage is proportional to a first temperature related to the first finFET, and wherein the second voltage is proportional to a second temperature related to the second finFET.

12. The device of claim 1, wherein the temperature sensing circuit includes an amplifier comprising:
a first input configured to receive the first voltage from the first body contact; and
a second input configured to receive the second voltage from the second body contact.

13. A method comprising:
receiving a first voltage from a first body contact formed at least partially in a first well of a first fin field-effect transistor (finFET) of a device, wherein the first voltage is responsive to a first current from a first current source with first physical characteristics;
receiving a second voltage from a second body contact formed at least partially in a second well of a second finFET of the device, wherein the second voltage is responsive to a second current from a second current source with second physical characteristics distinct from the first physical characteristics of the first current source; and
generating an output corresponding to a temperature of the device based on the first voltage and the second voltage.

14. The method of claim 13, wherein the output is generated based on a difference between the first voltage and the second voltage.

15. The method of claim 13, wherein a first source contact of the first finFET is electrically coupled to a second source contact of the second finFET.

16. The method of claim 13, wherein a first drain contact of the first finFET is electrically coupled to a second drain contact of the second finFET.

17. The method of claim 13, wherein a first gate contact of the first finFET is electrically coupled to a second gate contact of the second finFET.

18. The method of claim 13, wherein the first current source is electrically coupled to the first body contact, and wherein a second current source is electrically coupled to the second body contact.

19. The method of claim 13, wherein the first voltage is proportional to a first temperature related to the first finFET, and wherein the second voltage is proportional to a second temperature related to the second finFET.

20. A device comprising:
a first fin field-effect transistor (finFET) including a first well;
a first body contact formed at least partially in the first well;
a second finFET including a second well;
a second body contact formed at least partially in the second well; and
a temperature sensing circuit including:
an amplifier comprising:
a first input electrically coupled to the first body contact; and
a second input electrically coupled to the second body contact;
a first current source with first physical characteristics electrically coupled to the first body contact; and
a second current source with second physical characteristics distinct from the first physical characteristics, the second current source electrically coupled to the second body contact.

21. The device of claim 20, wherein the first finFET includes a first p-type metal-oxide-semiconductor (PMOS) transistor and the second finFET includes a second PMOS transistor.

22. The device of claim 20, wherein the first current source includes a first n-type metal-oxide-semiconductor (NMOS) transistor and the second current source includes a second NMOS transistor.

23. The device of claim 20, wherein the first finFET includes a first n-type metal-oxide-semiconductor (NMOS) transistor and the second finFET includes a second NMOS transistor.

24. The device of claim 20, wherein the first current source includes a first p-type metal-oxide-semiconductor (PMOS) transistor and the second current source includes a second PMOS transistor.

25. The device of claim 20, wherein the first current source provides a first current to the first body contact, wherein the second current source provides a second current to the second body contact, and wherein the first current is distinct from the second current.

26. The device of claim 20, wherein the first body contact is configured to output a first voltage that is proportional to a first temperature related to the first finFET, and wherein the second body contact is configured to output a second voltage that is proportional to a second temperature related to the second finFET.

27. The device of claim 26, wherein the amplifier further includes an output configured to generate an output voltage based on a difference of the first voltage and the second voltage.

28. The device of claim 20, wherein the first finFET further includes a first source contact, a first drain contact, and a first gate contact, wherein the first source contact is coupled to a first circuitry, the first drain contact is coupled to a second circuitry, and wherein the first finFET is configured to provide an electrical path between the first circuitry and the second circuitry responsive to a first voltage applied to the first gate contact.

29. An apparatus comprising:
means for receiving a first voltage from a first body contact formed at least partially in a first well of a first fin field-effect transistor (finFET) of a device;
means for receiving a second voltage from a second body contact formed at least partially in a second well of a second finFET of the device; and
means for comparing the first voltage and the second voltage to generate an output voltage corresponding to a temperature of the device.

30. The apparatus of claim 29, wherein the means for receiving the first voltage, the means for receiving the second voltage, and the means for generating the output voltage are integrated into at least one of a communications device, a fixed location data unit, a mobile location data unit, a mobile phone, a cellular phone, a satellite phone, a computer, a tablet, a portable computer, a desktop computer, a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, or a portable digital video player.

* * * * *